United States Patent [19]

Sauer

[11] Patent Number: 4,560,955
[45] Date of Patent: Dec. 24, 1985

[54] MONOLITHIC INTEGRATED TRANSISTOR HF CRYSTAL OSCILLATOR CIRCUIT

[75] Inventor: Wolfgang Sauer, Freiburg, Fed. Rep. of Germany

[73] Assignee: ITT Industries, Inc., New York, N.Y.

[21] Appl. No.: 634,960

[22] Filed: Jul. 27, 1984

[30] Foreign Application Priority Data

Jul. 29, 1983 [EP] European Pat. Off. ........ 83107491.9

[51] Int. Cl.$^4$ ............................................. H03B 5/36
[52] U.S. Cl. ................................ 331/116 R; 330/252; 331/159
[58] Field of Search ............ 331/116 R, 116 FE, 159; 330/252

[56] References Cited

U.S. PATENT DOCUMENTS 3,763,439 10/1973 Peil .............................. 331/116 R X
3,973,221 8/1976 Jett, Jr. ......................... 331/116 R X
4,128,817 12/1978 Gomi ............................ 331/116 R X Primary Examiner—Siegfried H. Grimm
Attorney, Agent, or Firm—Donald J. Lenkszus

[57] ABSTRACT

To increase the gain and, consequently, to increase the voltage amplitude appearing at the crystal of a crystal oscillator a conventional circuit including a first differential amplifier in the amplifier section and two further differential amplifiers in the phase shifting section is modified to include a fourth differential amplifier in the amplifier section. The fourth amplifier carries an additional current to flow in the two differential amplifiers causing an additional current to flow and across the operating resistance of the two differential amplifiers an additional voltage drop being fed to the crystal via an emitter follower.

1 Claim, 1 Drawing Figure

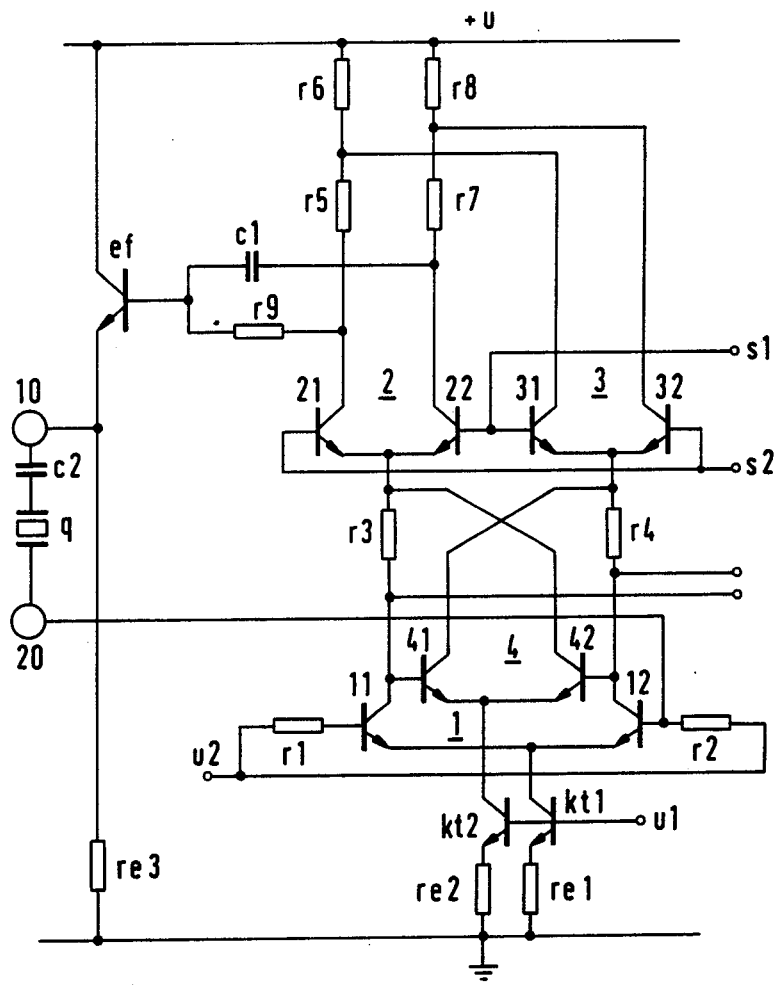

MONOLITHIC INTEGRATED TRANSISTOR HF CRYSTAL OSCILLATOR CIRCUIT

BACKGROUND OF THE INVENTION

This invention pertains to a monolithic integrated transistor HF crystal oscillator circuit.

One such oscillator is described in "Valvo-Berichte", April 1974, pages 18 to 20 for a frequency of oscillation of 8.8 MHz. In redesigning the prepublished crystal oscillator circuit for oscillating frequencies higher than 8.8 MHz, in particular for about double the oscillating frequency of 17.7 MHz it was found by the inventor that the amplifier section of the crystal oscillator circuit has insufficient amplification because no sufficient amplitude appears at the crystal. This disadvantage could be remedied simply by having the amplifier section preceded by a further amplifier stage. This measure, however, results in unwanted phase shiftings produced by subsequently arranged amplifier stages at the higher frequencies.

SUMMARY OF THE INVENTION

It is the object of the invention to overcome the disadvantage of the insufficient amplification in the amplifier section of the crystal oscillator circuit without employing a subsequently arranged amplifier stage.

To increase the gain and, consequently, to increase the voltage amplitude appearing at the crystal of a crystal oscillator a conventional circuit including a first differential amplifier in the amplifier section and two further differential amplifiers in the phase shifting section is modified to include a fourth differential amplifier in the amplifier section. The fourth amplifier carries an additional current to flow in the two differential amplifiers causing an additional current to flow and across the operating resistance of the two differential amplifiers an additional voltage drop being fed to the crystal via an emitter follower.

One advantage of the invention is that without the use of an additional, subsequently arranged amplifier stage sufficient amplification is achieved within the amplifier section of the crystal oscillator circuit itself.

BRIEF DESCRIPTION OF THE DRAWINGS

The invention will now be described with reference to the oscillator circuit diagram shown in the accompanying drawing.

DETAILED DESCRIPTION

The crystal oscillator circuit includes a crystal q and, in this particular case, a second capacitor c2 arranged in series therewith which, however, may also be omitted. This series arrangement is connected to two outer terminals 10, 20 of the monolithic integrated oscillator circuit. The integrated portion of the oscillator circuit contains the four differential amplifiers 1, 2, 3, 4 with the further stages and components assigned thereto. The first differential amplifier 1 together with first and second transistors 11, 12, a first constant current transistor kt1 arranged within the common emitter circuit of these transistors, and first and second resistor r1, r2, forms the amplifier section of the oscillator circuit to which, according to the invention there also belongs the fourth differential amplifier having first and second transistors 41, 42, and the second constant current transistor kt2. The constant current transistors kt1, kt2 are connected with their respective emitter resistors re1, re2, to the zero point of the circuit and, with their respective collectors, to the emitters of the transistors 11, 12 or 41, 42 respectively, while the base electrodes thereof are connected to a common constant potential u1. The values of u1 and re1 or re2 are determinative of the value of the respective constant current.

The base electrodes of the transistors 11, 12, are connected to a further constant potential u2, via resistors r1, r2, respectively. The base electrode of the first transistor 41 of the fourth differential amplifier 4 is connected to the collector of the first transistor 11 of the first differential amplifier 1 and, in comparatively the same way, the base electrode of the transistor 42 is connected to the collector of the transistor 12. The collector of transistor 11 is connected via resistor r3 to the commonly connected emitters of transistors 21, 22 of the second differential amplifier 2. Likewise, the collector of transistor 12 is connected to the commonly connected emitters of transistors 31, 32, of the third differential amplifier 3 via resistor r4. The sinusoidal output signal of the crystal oscillator circuit can be taken off the collectors of the transistors 11, 12.

According to the invention, the collector of the first transistor 41 of the fourth differential amplifier 4 is connected to the emitters of transistors 31, 32 of the third differential amplifier 3, and the collector of the second transistor 42 of the fourth differential amplifier 4 is connected to the emitters of transistors 21, 22 of the second differential amplifier 2.

The base electrode of the first transistor 21 of the second differential amplifier 2 is connected to that of the second transistor 32 of the third differential amplifier 3, and the base of the second transistor 22 of the second differential amplifier 2 is connected to that of the first transistor 31 of the third differential amplifier 3.

The base electrodes of transistors 21, 32 are coupled to terminal s2 and the base electrode of transistor 22, 31 are coupled to terminal s7. Voltages applied to terminals s7, s2 influence the frequency of the oscillator circuit as in the aforementioned prior art circuit. Within the connections to the respective collectors 21, 22 of the second differential amplifier 2 there is disposed the series arrangement consisting of the fifth and sixth resistor r5, r6 or of the seventh and the eight rsistor r7, r8 respectively, with the resistors r6, r8 being connected to the supply voltage. To the junction points of the resistors r5, r6 or that of the resistors r7, r8 there is connected the collector of the transistor 31 or that of the transistor 32 of the third differential amplifier 3 respectively.

The collector of transistor 22 of the second amplifier 2 is connected, via the first capacitor c1, to the base electrode of emitter follower transistor ef. In the same way the collector of transistor 21 of the second differential amplifier 2, via the ninth resistor r9, is connected to the base electrode of this transistor ef. The emitter of transistor ef is connected to terminal 10 and is also coupled to the zero point of the circuit via emitter resistor re3.

Terminal 20 is connected to the base electrode of the second transistor 12 of the first differential amplifier 1.

By providing the fourth differential amplifier 4, in accordance with the invention, and its associated second constant current transistor kt2, the phase-shifting portions of the oscillator circuit, as contained in both the second and the third differential amplifiers 2, 3 and, consequently, also the voltage amplitude appearing at the crystal q are sufficiently large, because the fourth differential amplifier 4 causes an additional current to flow in the two differential amplifiers 2, 3. The fourth differential amplifier thus also causes a correspondingly enlarged voltage drop to appear across the resistors r5, r6 or r7, r8 of the second differential amplifier 2, respectively. The enlarged voltage drop is, for example, double the value it would be otherwise.

The above described embodiment utilizes bipolar transistors. However, as will be appreciated by those skilled in the art, the invention is not restricted to the use of bipolar transistors, but can be equally well realized with the aid of insulated-gate field-effect transistors, in accordance with the so-called MOS technology. In that case, the resistors, for example, can be realized with the aid of correspondingly connected MOS transistors.

What is claimed is:

1. In a monolithic integrated transistor HF crystal oscillator circuit comprising:
   a crystal;
   an amplifier section including a first differential amplifier, a first constant current transistor in the emitter circuit of said first differential amplifier;
   a phase shifting section including second and third differential amplifiers and a first capacitor;
   an emitter follower; and
   circuit means coupling the output of said emitter follower to said crystal;
   said first differential amplifier comprising first and second transistors, the base electrode of said first transistor being connected via a first resistor to a constant potential, the base electrode of said second transistor being connected to said constant potential via a second resistor, and said crystal being connected to said base electrode of said second transistor;
   said second differential amplifier including third and fourth transistors having their emitters connected in common and coupled via a third resistor to the collector of said first transistor;
   said third differential amplifier including fifth and sixth transistors having their emitters connected in common and coupled via a fourth resistor to the collector of said second transistor;
   first and second output terminals coupled respectively to the collector of said first and second transistors for providing a sinusoidal output signal;
   fifth and sixth resistors serially connected between a potential source and the collector of said third transistor, the collector of said fifth transistor being connected to the junction of said fifth and sixth resistors;
   seventh and eighth resistors serially connected between said potential source and the collector of said fourth transistor, the collector of said sixth transistor being connected to the junction of said seventh and eighth resistors;
   said first capacitor coupling the collector of said fourth transistor to the input of said emitter follower;
   a ninth resistor coupling the collector of said third transistor and said emitter follower input;
   the base of said third transistor being coupled to the base of said sixth transistor;
   the base of said fourth transistor being coupled to the base of said fifth transistor;
   a fourth differential amplifier in said amplifier section comprising seventh and eighth transistors, the base of said seventh transistor being coupled to the collector of said first transistor, the base of said eighth transistor being coupled to the collector of said second transistor, the collector of said seventh transistor being coupled to the emitters of said fifth and sixth transistors, the collector of said eighth transistor being coupled to the emitters of said third and fourth transistors; and
   a second constant current transistor coupled to the emitters of said seventh and eighth transistors, the bases of said first and second constant current transistors being coupled to a constant potential.

* * * * *